United States Patent [19]
Lee

[11] Patent Number: 5,754,474
[45] Date of Patent: May 19, 1998

[54] VARIABLE THRESHOLD VOLTAGE ADJUSTMENT CIRCUIT FOR SEMICONDUCTOR DEVICE

[75] Inventor: Byung Il Lee, Daejeon-si, Rep. of Korea

[73] Assignee: LG Semicon Co., Ltd., Chungcheongbuk-Do, Rep. of Korea

[21] Appl. No.: 619,953

[22] Filed: Mar. 20, 1996

[30] Foreign Application Priority Data

Oct. 11, 1995 [KR] Rep. of Korea ............... 34831/1995

[51] Int. Cl.⁶ ........................................... G11C 11/34
[52] U.S. Cl. ........................ 365/185.24; 365/185.03
[58] Field of Search ....................... 365/185.24, 185.2, 365/185.19, 168, 185.03

[56] References Cited

U.S. PATENT DOCUMENTS

| | | | |
|---|---|---|---|
| 5,394,362 | 2/1995 | Banks | 365/185.24 |
| 5,424,978 | 6/1995 | Wada | 365/168 |
| 5,521,865 | 5/1996 | Ohuchi | 365/185.22 |
| 5,539,690 | 7/1996 | Talreja | 365/168 |

*Primary Examiner*—A. Zarabian
*Attorney, Agent, or Firm*—Morgan, Lewis & Bockius LLP

[57] ABSTRACT

A variable threshold voltage adjustment circuit for a semiconductor device includes a transistor for supplying a first voltage in response to a first data signal, a program unit for outputting a multi-stage voltage in response to the first data signal and a second data signal, and a nonvolatile memory device connected to the transistor and having a logic threshold voltage corresponding to the multi-stage voltage of the program unity.

11 Claims, 8 Drawing Sheets

$V_{T1} \neq V_{T2} \neq V_{T3}$

VARIABLE THRESHOLD VOLTAGE ADJUSTMENT CIRCUIT FOR SEMICONDUCTOR DEVICE

BACKGROUND OF THE INVENTION

1. Field of the Invention

The present invention relates to a variable threshold voltage adjustment circuit for a semiconductor device, and more particularly, to a variable threshold voltage adjustment circuit for a semiconductor device using a programmable nonvolatile memory such as an electrically programmable read only memory (EPROM) or an electrically erasable and programmable read only memory ($E^2$PROM).

2. Discussion of the Related Art

In general, a threshold voltage is determined by impurity ion implantation in manufacturing a semiconductor device. It is the point at which an input voltage Vin is converted to an output voltage Vout and defines the turn-on or turn-off state of a transistor. A logic threshold voltage adjusts the threshold voltage to precisely determine the logical characteristics of the transistor.

An inverter for a conventional threshold adjustment circuit will now be described with reference to the accompanying drawings. FIGS. 1a to 1e are a cross-sectional views showing the process of ion implantation for determining the threshold voltage of a conventional semiconductor device. FIGS. 2a and 2b illustrate the embodiment of a conventional inverter to which threshold voltage ions are implanted.

As shown in FIG. 1a, an isolation oxide film 2 is formed on a semiconductor substrate 1, thereby defining an active region and an isolation region. Thereafter, a first photoresist 3 is deposited on the entire surface of isolation oxide film 2 and semiconductor substrate 1. The photoresist is developed and exposed to form a first photoresist pattern on the active region of semiconductor substrate 1. Then, a first threshold voltage ion implantation is performed.

Subsequently, as shown in FIG. 1b, after first photoresist 3 is removed, a second photoresist 4 is deposited on the entire surface of the semiconductor substrate 1. A second photoresist pattern is formed on the active region adjacent to the ion-implanted region by developing and exposing the second photoresist 4. Then, a second threshold voltage ion implantation is performed.

Thereafter, as shown in FIG. 1c, after second photoresist 4 is removed, a third photoresist 5 is deposited on the whole surface thereof. A third photoresist pattern is formed on the active region adjacent to the ion-implanted region by photolithography, and a third threshold voltage ion implantation is performed.

Next, as shown in FIG. 1d, a gate electrode 6 is formed on a predetermined portion of the active region of ion-implanted semiconductor substrate 1. Thereafter, high-concentration impurity ions are implanted in the semiconductor substrate 1 on both sides of gate electrode 6 to form source and drain regions 7, thereby forming a plurality of transistors.

FIG. 1e is a circuit briefly illustrating a transistor formed in the process described above.

According to one conventional embodiment, an inverter shown in FIG. 2a includes a P-metal oxide semiconductor field effect transistor (P-MOSFET) 1 controlled by a signal (low or high) of an input terminal Vin and N-MOSFET 2 connected in parallel. An inverter shown in FIG. 2b includes an N-MOSFET 3 controlled by a signal (low or high) of an input terminal Vin and a load resistor connected to an applied voltage terminal Vdd.

The operation of the inverter for the conventional threshold voltage adjustment circuit having the aforementioned configuration is to program a logic threshold voltage by performing the impurity ion implantation suitable to the characteristics of P-MOSFET 1 as shown in FIG. 2a and the impurity ion implantation suitable to characteristics of N-MOSFET 2. Thus, if the input terminal Vin is low, P-MOSFET 1 is turned on to output a logic high to the output terminal Vout. If the input terminal Vin is high, N-MOSFET 2 is turned on to output a logic low to the output terminal Vout.

Also, as shown in FIG. 2b, the logic threshold voltage for N-MOSFET 3 is programmed. Thus, if the input terminal Vin is low, N-MOSFET 3 is turned off to output a logic high. If the input terminal Vin is high, N-MOSFET 3 is turned on to output a logic low by load element of the output terminal Vout.

The inverter for the conventional threshold voltage adjustment circuit having the aforementioned configuration encounters the following problems.

First, as shown in FIGS. 1a to 1e, in order to program various threshold voltages corresponding to the number of transistors to be suitable to the characteristics of the inverter by an ion implantation, several masking operations must be performed.

Second, since the threshold voltage VT is programmed in the characteristics of the circuit manufactured in the manner as described above, it is difficult to change the logic characteristics of the circuit, which makes minute adjustment of an analog circuit impossible.

Third, in order to change the logic threshold or gain characteristics of the circuit, an external device must be connected from outside the chip.

SUMMARY OF THE INVENTION

Accordingly, the present invention is directed to a variable threshold voltage adjustment circuit that substantially obviates one or more of the problems due to limitations and disadvantages of the related art.

An object of the present invention is to provide a variable threshold voltage adjustment circuit for a semiconductor device in which a threshold voltage of a transistor can be easily varied using a capacitance formed between a control gate and a floating gate of a programmable nonvolatile memory device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the variable threshold voltage adjustment circuit includes a transistor for supplying a first voltage in response to a first data signal, a program unit for outputting a multistage voltage in response to the first data signal and a second data signal, and a nonvolatile memory device connected to the transistor and having a logic threshold voltage corresponding to the multi-stage voltage of the program unit.

In a further aspect, the variable threshold voltage adjustment circuit includes a program unit for outputting a multi-stage voltage in response to a first data signal and a second data signal, a nonvolatile memory device having a logic threshold voltage corresponding to the multi-stage voltage of the program unit, a first transistor operated in response to an amplification signal, the first transistor being connected to the nonvolatile memory device, a second transistor for receiving a reference signal, the reference signal always being in an intermediate state of a first signal state and a second signal state, a third transistor for supplying a first voltage to the nonvolatile memory device in response to a signal from the second transistor, and a fourth transistor for supplying a first voltage to the second transistor in response to a signal from the second transistor.

In another aspect, the variable threshold voltage adjustment circuit includes a first transistor for supplying a first voltage, a program unit for outputting a multi-stage voltage in response to a first data signal and a second data signal, and a nonvolatile memory device connected to the first transistor and having a logic threshold voltage corresponding to the multi-stage voltage of the program unit.

In another aspect, the variable threshold voltage adjustment circuit includes a transistor having a first terminal coupled to receive an input signal, a second terminal coupled to a first potential, and a third terminal coupled to an output terminal, a non-volatile memory cell having a first terminal, a second terminal coupled to the output terminal, and a third terminal coupled to a second potential, and a program unit, receiving the input signal and a programming signal, for adjusting the threshold voltage of the non-volatile memory cell in response to the programming signal in a programming mode and for supplying the input signal to the non-volatile memory cell in an output mode, wherein the transistor and the non-volatile memory will generate an output signal on the output terminal when in output mode.

To further achieve the objects and in accordance with the purpose of the present invention, as embodied and broadly described, the variable threshold voltage adjustment circuit for a semiconductor device includes a first transistor for supplying a first voltage in accordance with a first data signal divided into low and high, a program unit for outputting multi-stage voltage characteristic in accordance with the first data signal and a second data signal, and a nonvolatile memory device connected to the first transistor and having a logic threshold voltage characteristic corresponding to the multi-stage voltage characteristic of the program unit.

In another aspect, the variable threshold voltage adjustment circuit for a semiconductor device includes a program unit for outputting multi-state voltage characteristic in accordance with a first data signal divided into low and high and a second data signal, a nonvolatile memory device connected to the first transistor and having a logic threshold voltage characteristic corresponding to the multi-stage voltage characteristic of the program unit, a second transistor connected to the nonvolatile memory device for being operated in accordance with a low value and a high value of an amplification (AMP) signal, a third transistor for receiving a reference signal being in an intermediate state of a first signal state and a second signal state for being operated all the time, a fourth transistor for supplying a first voltage to the nonvolatile memory device in accordance with the state of a signal generated by the third transistor; and a fifth transistor for supplying a first voltage to the third transistor in accordance with the state of a signal generated by the third transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 6a is a circuit diagram of the second embodiment of the variable threshold voltage adjustment circuit for a semiconductor device according to the present invention;

FIG. 6b is a timing diagram for the variable threshold voltage adjustment circuit.

DETAILED DESCRIPTION OF THE PREFERRED EMBODIMENTS

Reference will now be made in detail to the preferred embodiments of the present invention, examples of which are illustrated in the accompanying drawings.

Figure 1A:
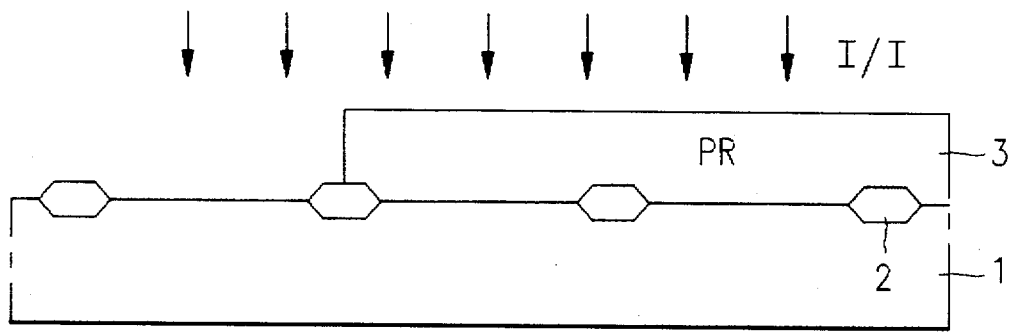
FIGS. 1a–1e are a cross-sectional views of a conventional semiconductor device showing the process of a threshold voltage ion implantation.
Figure 1B:
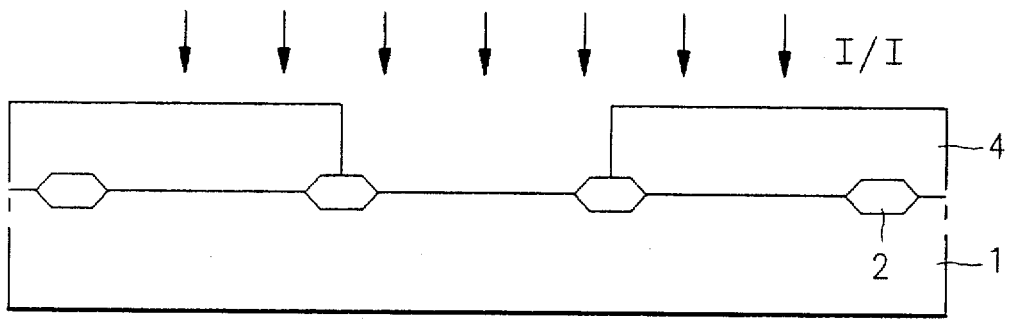
Figure 1C:
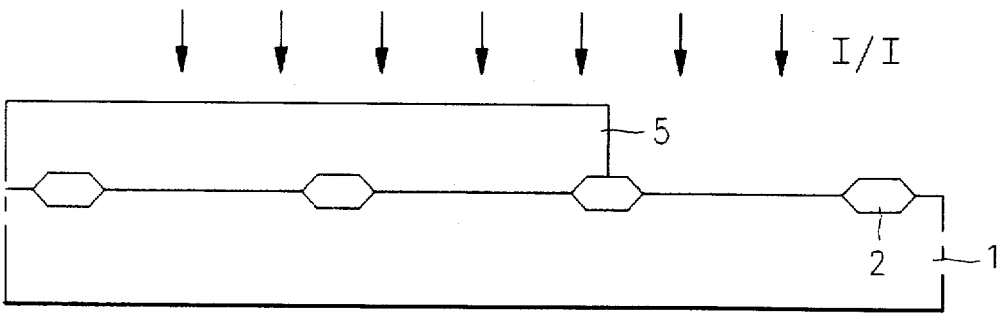
Figure 1D:
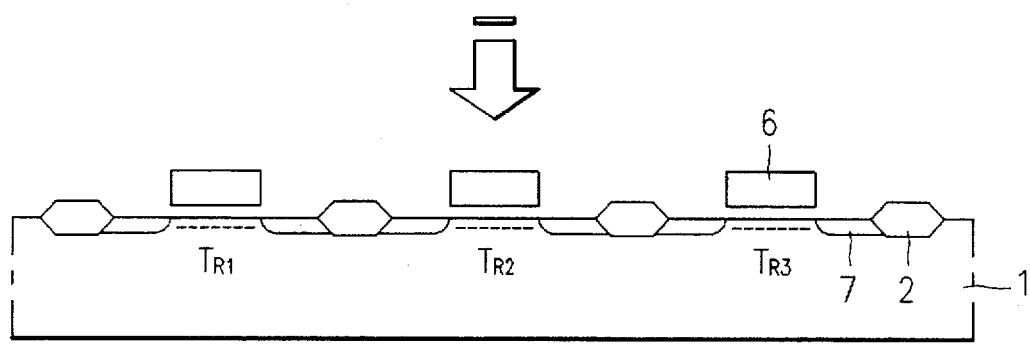
Figure 1E:
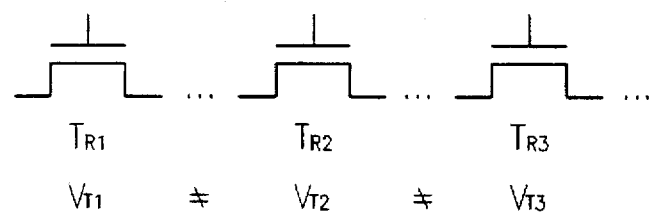
Figure 2A:
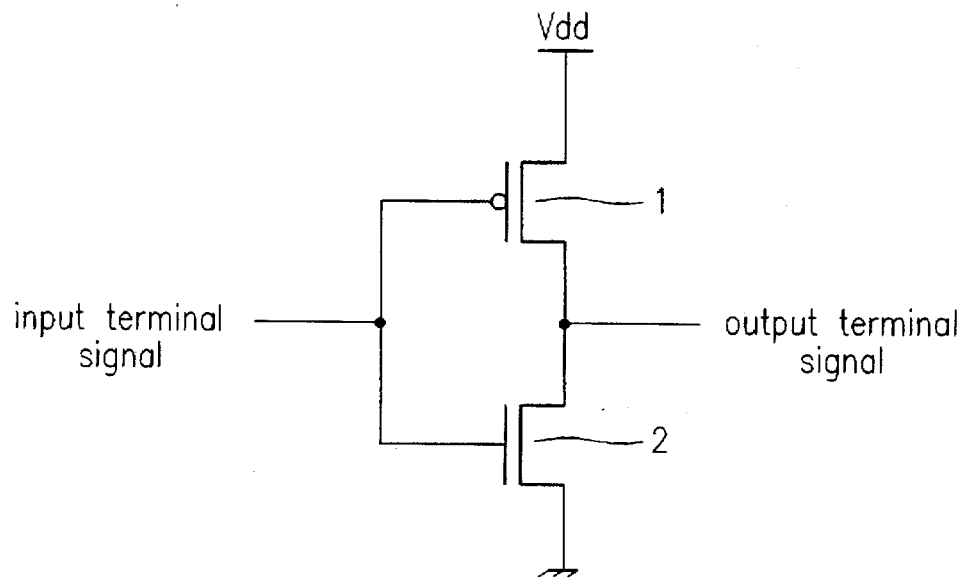
FIGS. 2a and 2b illustrate an embodiment of an inverter having a conventional ion implanted threshold voltage.
Figure 2B:
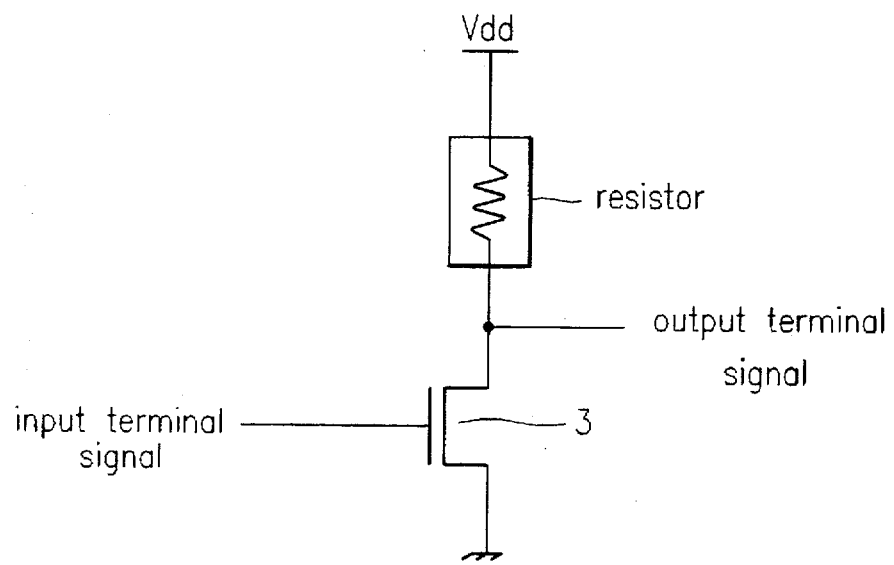
Figure 3A:
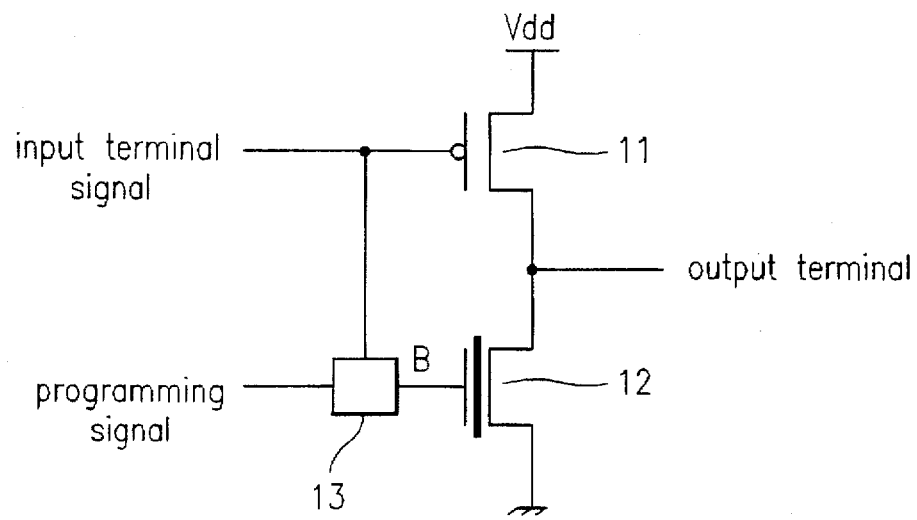
FIG. 3a is a circuit diagram of a first embodiment of the variable threshold voltage adjustment circuit for a semiconductor device according to the present invention.

As shown in FIG. 3a, an inverter according to a first embodiment of the present invention includes a P-MOSFET 11 operated by an input terminal signal (Vin), a program unit 13 for determining the capacitor characteristics of an N-MOSFET nonvolatile memory 12 in response to the input terminal signal and programming signal, and an N-MOS nonvolatile memory 12 indicating the operation extent in accordance with the signal magnitude of program unit 13 and the signal duration. An output terminal is coupled between the drains of the P-MOSFET 11 and the N-MOSFET 12 and provides an output terminal signal (Vout).

Figure 3B:
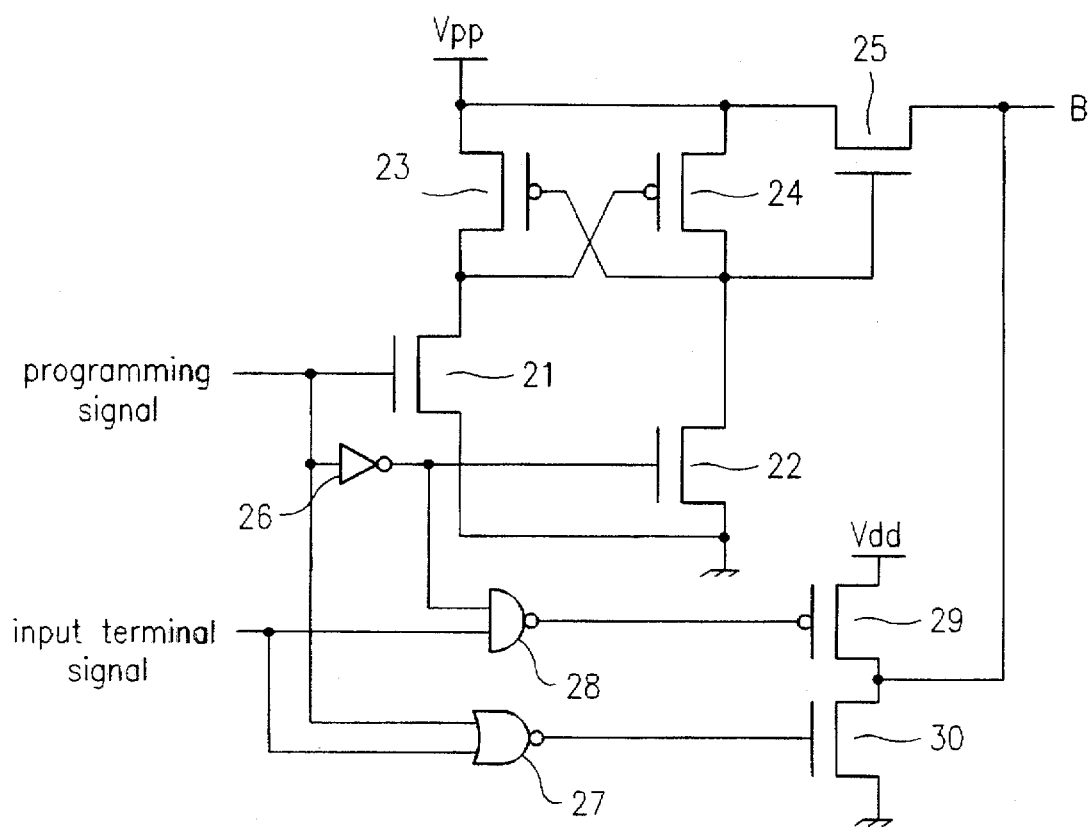
FIG. 3b is a detailed circuit diagram of the program unit according to the present invention.

As shown in FIG. 3b, program unit 13 includes a first N-MOSFET 21 operated in accordance with a programming signal, a second N-MOSFET 22 operated in accordance with an inverted programming signal, first and second P-MOSFETs 23 and 24 operated in accordance with a signal passed through first and second N-MOSFETs 21 and 22, an inverter 26 for inverting the programming signal, a NOR gate 27 for supplying an N-MOS operation signal in accordance with the programming signal and input terminal signal, a NAND gate 28 for supplying a P-MOS operation signal in accordance with the inverted programming signal and input terminal signal, a third P-MOSFET 29 and a fourth N-MOSFET 30 operated in accordance with signals supplied from NOR gate 27 and NAND gate 28, respectively.

The operation of the inverter according to the first embodiment of the variable threshold voltage adjustment circuit of the present invention having the aforementioned configuration will now be described.

If a low signal is applied to an input terminal, P-MOSFET 11 is turned on. Concurrently, if a high signal is applied to a programming signal port, both low and high signals are applied to program unit 13 and are supplied as a high signal, thereby programming a threshold voltage to N-MOS nonvolatile memory 12.

At this time, P-MOSFET 11 is turned on and N-MOS nonvolatile memory 12 is turned off, so that an output terminal is inverted to be displayed as a logic high.

If a high signal is applied to the input terminal, P-MOSFET 11 is turned off. Also, if a low signal is applied to programming signal terminal, threshold-voltage-programmed N-MOS nonvolatile memory 12 is normally turned on, so that the output terminal is displayed as a logic low.

In other words, if both the programming signal terminal and input signal terminal apply high signals, N-MOS nonvolatile memory 12 programs the threshold voltage, irrespective of the input terminal signal Vin. If a low signal is applied to the programming signal terminal only, the programmed N-MOS nonvolatile memory 12 operates in accordance with the voltage state (low or high) of the input terminal.

The operation of program unit 13 will now be described in more detail.

As shown in FIG. 3b, if the signal of the programming signal terminal is high and the input terminal signal is low, first N-MOSFET 21, second P-MOSFET 24, and third N-MOSFET 25 are turned on, and second N-MOSFET 22 is turned off in accordance with the programming signal received from the invertor 26. Third P-MOSFET 29 and fourth N-MOSFET 30 are turned off by converting the signal of the input terminal into the signals of NAND gate 28 and NOR gate 27 in accordance with the programming signal.

At this time, since Vpp is output to a terminal B via third N-MOSFET 25, a logic threshold voltage is programmed in N-MOS nonvolatile memory.

If the signal of the programming signal terminal is low and the input terminal signal is high, first N-MOSFET 21, second P-MOSFET 24, and third N-MOSFET 25 are turned off in accordance with the low signal of the programming signal terminal. In response to the programming signal from inverter 26, second N-MOSFET 22 and first P-MOSFET 23 are turned on, and second P-MOSFET 24 and third N-MOSFET 25 are turned off. Third P-MOSFET 29 is turned on by converting the signal of the input terminal into that of NAND gate 28 in accordance with the inverted programming signal. Therefore, N-MOS nonvolatile memory 12 is normally operated by the voltage Vdd.

If the input terminal signal and the programming signal are both low signals, they are output to a logic low concurrently. Therefore, N-MOS nonvolatile memory 12 is normally operated. However, both signals cannot be applied as high signals concurrently.

Figure 4:
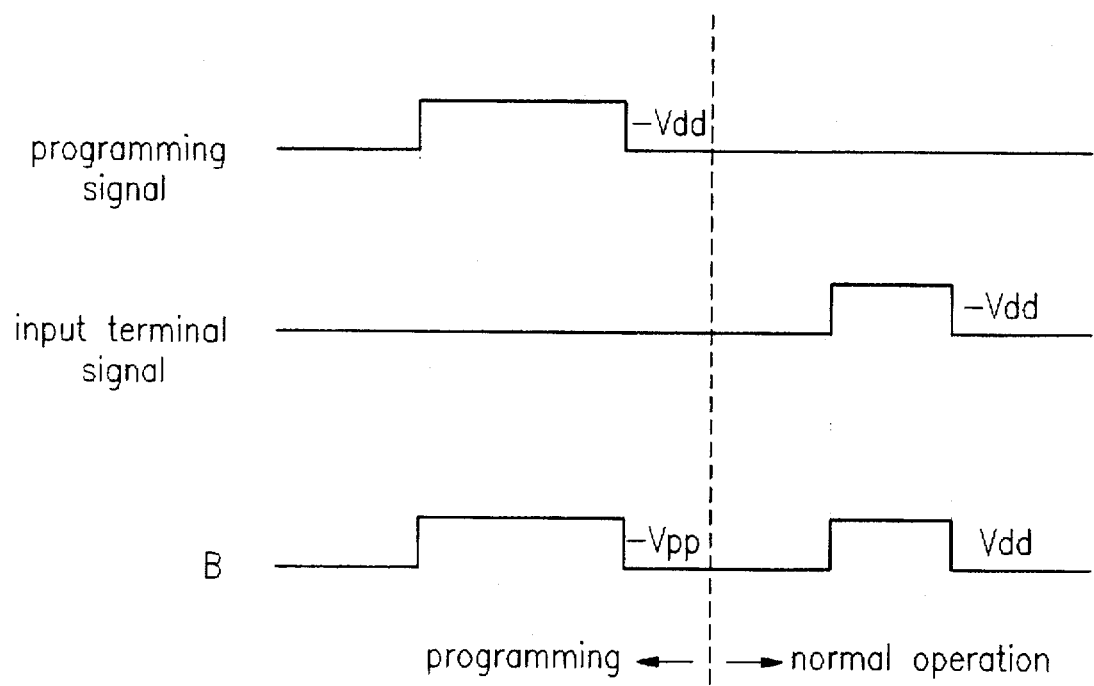
FIG. 4 is a timing diagram of the program unit according to the present invention.

The above-described operation of the program unit according to the present invention is summarized in timing chart shown in FIG. 4. If the input terminal signal is low and the programming signal is high, Vpp is applied to the terminal B, thereby programming the logic threshold voltage of N-MOS nonvolatile memory during the time which the programming signal is applied. If the programming signal is low and the input terminal signal is high, Vdd is applied to the terminal B, thereby operating the N-MOS nonvolatile memory normally.

At this time, the programming signal is a specific signal for programming and for determining the logic threshold voltage of the N-MOS nonvolatile memory 12 during the maintenance time, and the input terminal signal is a normally operating specific signal.

Figure 5A:
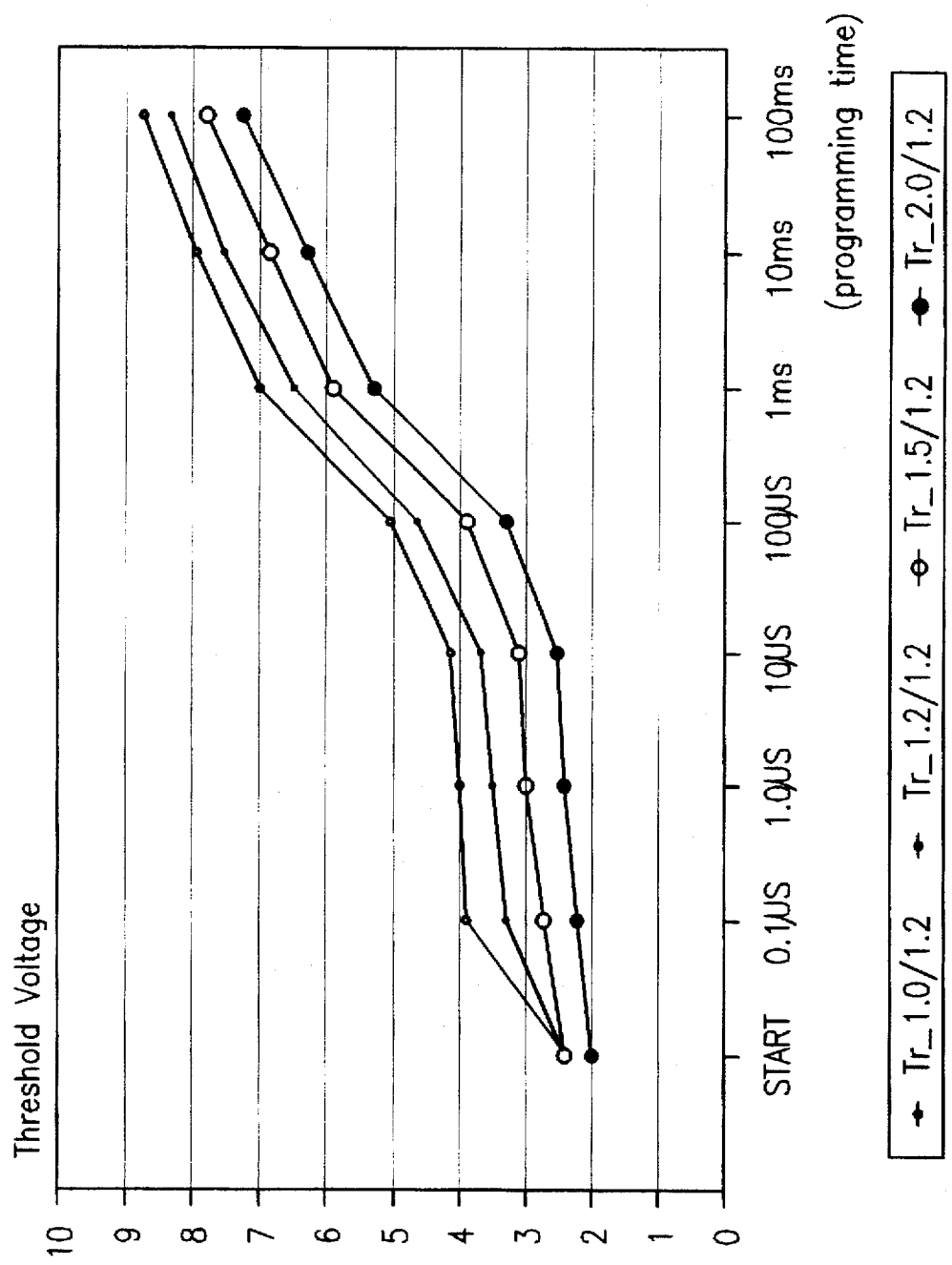
FIGS. 5a and 5b are graphs of a logic threshold voltage characteristic of the present invention and input/output characteristic thereof, respectively.

FIG. 5a shows the logic threshold voltage characteristic depending on the duration of the programming signal and the size of the N-MOS nonvolatile memory 12. The larger the N-MOS nonvolatile memory, which is different in size for the respective four word lines, the smaller the threshold voltage. If the programming time is increased, the threshold voltage is increased gradually. In other words, the threshold voltage is varied. Herein, different logic threshold voltage characteristics are displayed for each word line if the nonvolatile memory device receives a programming signal having a constant duration.

Figure 5B:
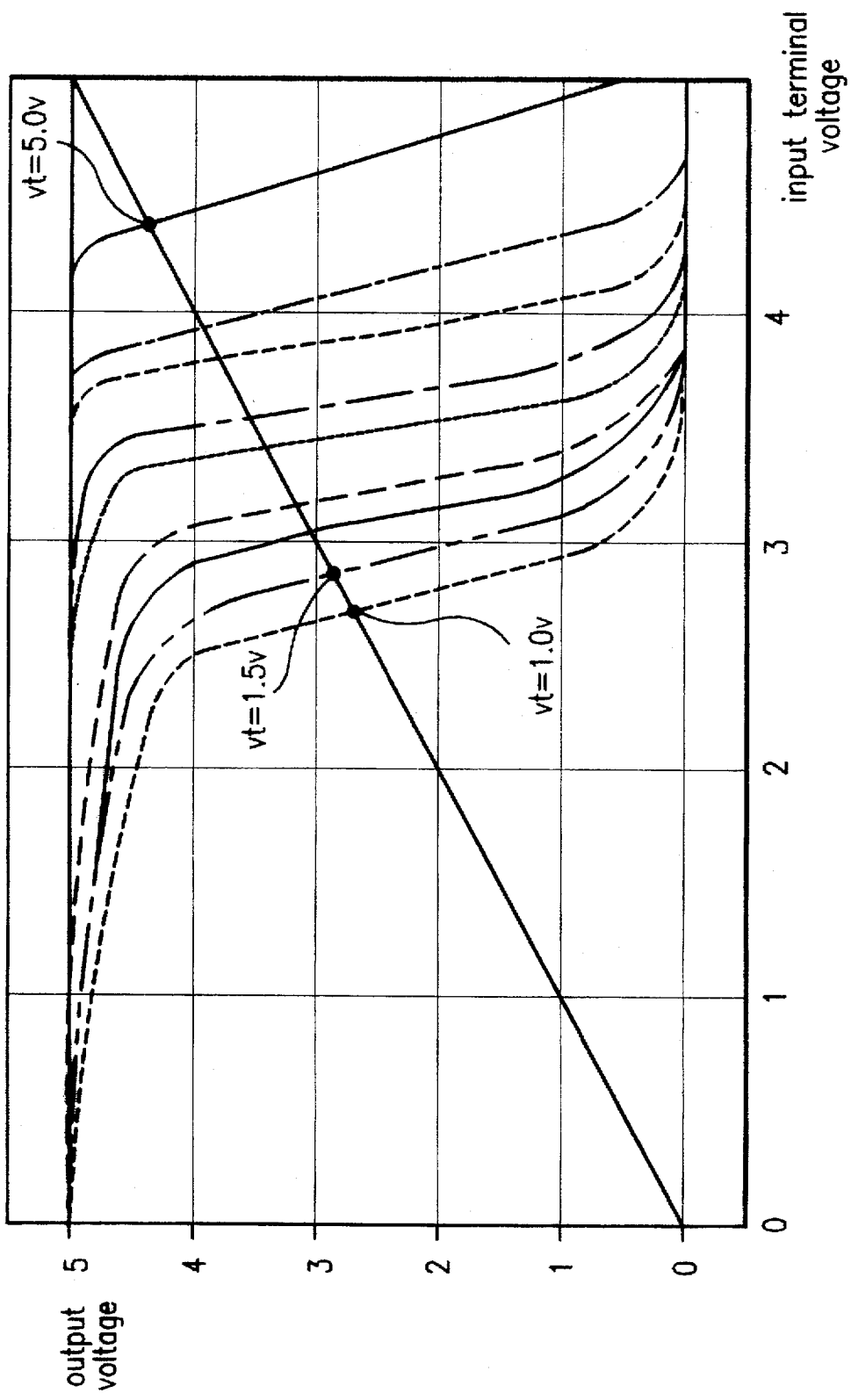
Figure 5A:
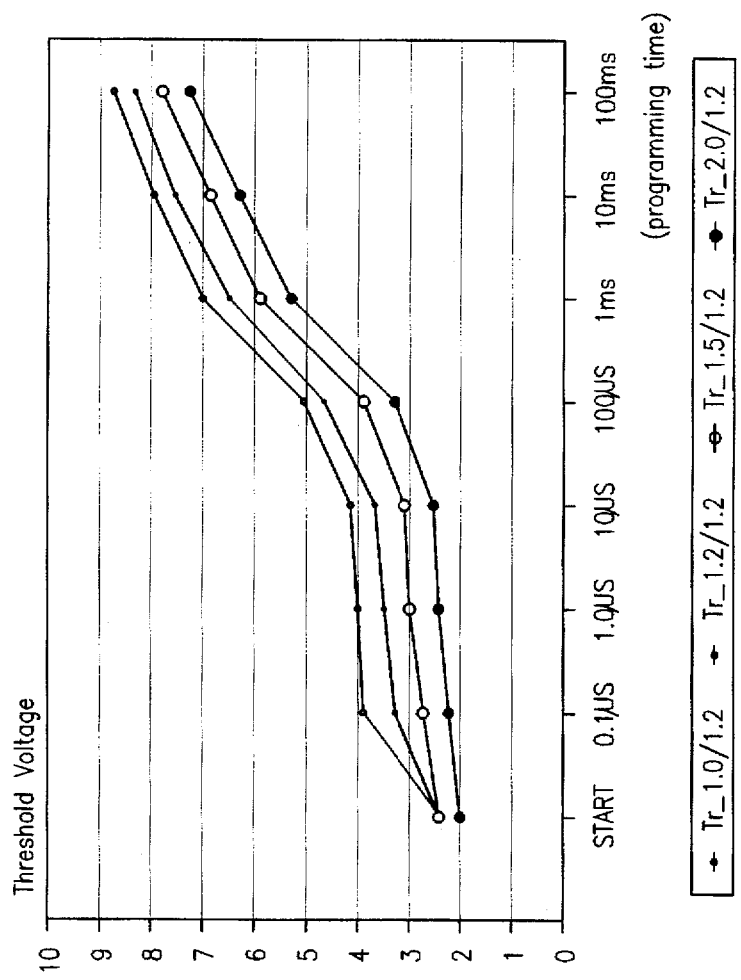

FIG. 5b shows the input/output voltage characteristics for the logic threshold voltage of the present invention, in which the curves represent that the threshold voltage is gradually increased with a slope of 1, depending on the duration of the programming time. In order to turn on the N-MOS nonvolatile memory, the threshold voltage exceeding the input voltage corresponding thereto should be applied, thereby inverting the output of the inverter according to the first embodiment of the present invention.

A second embodiment of the present invention will be described with reference to the accompanying drawings using the above-described characteristics.

As shown in FIG. 6a, the variable threshold voltage adjustment circuit according to the second embodiment of the present invention includes a program unit 31 operated by an input terminal signal and a programming signal, a nonvolatile memory 32 indicating the operation extent in accordance with the signal magnitude and duration of program unit 31, a fifth P-MOSFET 33 operated by a low signal for transferring the current, a sixth P-MOSFET 34, a fifth N-MOSFET 35 always operated by a reference signal, a sixth N-MOSFET 36 operated by an amplifier signal.

The operation of the variable threshold voltage adjustment circuit according to the second embodiment of the present invention will now be described with reference to FIG. 6b. As shown in FIG. 6b, before the programming signal is input to program unit 31, that is, before programming, if a reference signal is input during a low state of the programming signal, an amplifier signal of a high state is input, and an input terminal signal of a low state is input, fifth and sixth N-MOSFETs 35 and 36 are turned on, to thereby apply a low input to fifth and sixth P-MOSFETs 33 and 34 from ground. The reference signal is always in an intermediate state of a first signal state and a second signal state. Also, the nonvolatile memory is turned off by the input terminal signal and programming signal to output Vpp to the output port.

If the amplifier signal is low, the reference signal is generated, and the input terminal signal is changed from a low state into a state slightly higher than the reference signal, sixth N-MOSFET 36 and nonvolatile memory 32 are turned off, and fifth N-MOSFET 35 is turned on, so as to maintain an equilibrium input state to apply Vpp to fifth P-MOSFET 33, thereby allowing the output terminal to maintain the previous state.

After the programming signal is input to program unit 31, that is, after programming, where nonvolatile memory 32 is programmed with a high logic threshold voltage by the programming signal of a high state, if a reference signal is input, an amplifier signal of a high state is input, and an input terminal signal of a low state is input, the same results as that before programming is obtained. If the reference signal is input, the amplifier signal is low, the input terminal signal is changed from a low state into a state slightly higher than the reference signal, the same result as that before programming is also obtained.

If the input terminal state is higher than the logic threshold voltage state of nonvolatile memory 32, nonvolatile memory 32 is turned on, to extinguish the voltage Vpp applied to fifth P-MOSFET 33 into the ground via sixth N-MOSFET 36, thereby outputting a logic low to the output port.

As described above, since the variable threshold voltage adjustment circuit for a semiconductor device of the present invention can vary the logic threshold voltage, the masking operation of the threshold voltage ion implantation can be reduced in manufacturing semiconductor devices, thereby improving the productivity and yield.

Also, since the threshold voltage can be adjusted to be suitable to the characteristics of a desired circuit, a separate element connected outside the chip is not necessary.

It will be apparent to those skilled in the art that various modifications and variations can be made in the variable threshold voltage adjustment circuit of the present invention without departing from the spirit or scope of the invention. Thus, it is intended that the present invention cover the modifications and variations of this invention provided they come within the scope of the appended claims and their equivalents.

What is claimed is:

1. A variable threshold voltage adjustment circuit for a semiconductor device comprising:
   a program unit for outputting a multi-stage voltage in response to a first data signal and a second data signal, the multi-stage voltage being one of at least three levels;
   a nonvolatile memory device having logic threshold voltages corresponding to the multi-stage voltage received from the program unit;
   a first transistor operated in response to an amplification signal, the first transistor being connected to the nonvolatile memory device;
   a second transistor for receiving a reference signal, the reference signal always being in an intermediate state of a first signal state and a second signal state;
   a third transistor for supplying a first voltage to the nonvolatile memory device in response to a signal from the second transistor; and
   a fourth transistor for supplying the first voltage to the second transistor in response to a signal from the second transistor.

2. The variable threshold voltage adjustment circuit for a semiconductor device according to claim 1, wherein the program unit outputs a first voltage if the first data signal has a low value and the second data has a high value, outputs a second voltage if the first data signal has a high value and the second data signal has a low value, and outputs a third voltage if the first data signal and the second data signal both have a low value.

3. The variable threshold voltage adjustment circuit for a semiconductor device according to claim 1, wherein the second data signal is a programming signal and the logic threshold voltage characteristics of the nonvolatile memory device varies in accordance with a duration of the programming signal.

4. The variable threshold voltage adjustment circuit for a semiconductor device according to claim 1, wherein different logic threshold voltage characteristics are displayed for each word line if the nonvolatile memory device receives a programming signal having a constant duration.

5. A variable threshold voltage adjustment circuit for a semiconductor device, comprising:
   a first transistor for supplying a first voltage;
   a program unit for outputting a multi-stage voltage in response to a first data signal and a second data signal, the multi-stage voltage being one of at least three levels;
   a nonvolatile memory device connected to the first transistor and having logic threshold voltage characteristics corresponding to the multi-stage voltage received from the program unit;
   a second transistor operated in response to an amplification signal, the second transistor being connected to the nonvolatile memory device;
   a third transistor for supplying a signal to the first transistor according to a reference signal, the reference signal having a value between a first signal state and a second signal state; and
   a fourth transistor for supplying the first voltage to the third transistor according to the signal from the third transistor.

6. The variable threshold voltage adjustment circuit for a semiconductor device according to claim 5, wherein the program unit outputs a first voltage if the first data signal has a low value and the second data has a high value, outputs a second voltage if a first data signal has a high value and a second data signal has a low value, and outputs a third voltage if the first data signal and the second data signal both have a low value.

7. The variable threshold voltage adjustment circuit for a semiconductor device according to claim 5, wherein the logic threshold voltage characteristics of the nonvolatile memory device varies in response to a duration of a programming signal.

8. The variable threshold voltage adjustment circuit for a semiconductor device according to claim 5, wherein different logic threshold voltage characteristics are displayed for each word line if the nonvolatile memory device receives a programming signal having a constant duration.

9. A circuit having variable voltage adjustment comprising:
   a transistor having a first terminal coupled to receive an input signal, a second terminal coupled to a first potential, and a third terminal coupled to an output terminal;
   a non-volatile memory cell having a first terminal, a second terminal coupled to the output terminal, and a third terminal coupled to a second potential; and
   a program unit, receiving the input signal and a programming signal, for adjusting the threshold voltage of the non-volatile memory cell in response to the programming signal in a programming mode and for supplying the input signal to the non-volatile memory cell in an output mode, wherein the transistor and the non-volatile memory will generate an output signal on the output terminal when in output mode.

10. The variable threshold voltage adjustment circuit according to claim 1, further comprising an output terminal electrically connected between the transistor and the non-volatile memory.

11. The variable threshold voltage adjustment circuit according to claim 5, further comprising an output terminal electrically connected between the transistor and the first nonvolatile memory.

* * * * *